United States Patent [19]
Kalkhoran et al.

[11] Patent Number: 5,726,440
[45] Date of Patent: Mar. 10, 1998

[54] WAVELENGTH SELECTIVE PHOTODETECTOR

[75] Inventors: Nader M. Kalkhoran, Tewksbury; Fereydoon Namavar, Westford, both of Mass.

[73] Assignee: Spire Corporation, Bedford, Mass.

[21] Appl. No.: 553,875

[22] Filed: Nov. 6, 1995

[51] Int. Cl.$^6$ .................................................. H01L 31/0352
[52] U.S. Cl. ........................ 250/214.1; 257/436; 257/464
[58] Field of Search ...................... 250/214.1; 257/436, 257/437, 458, 464

[56] References Cited

U.S. PATENT DOCUMENTS

| | | | |
|---|---|---|---|
| H1423 | 4/1995 | Flesner et al. | 257/347 |
| 4,513,305 | 4/1985 | Bloss, III et al. | 257/436 |
| 4,614,871 | 9/1986 | Driscoll | 250/372 |
| 4,835,393 | 5/1989 | Krauss | 250/373 |
| 4,977,325 | 12/1990 | Bowen et al. | 250/208.1 |
| 5,093,564 | 3/1992 | Miyagaki et al. | 250/208.1 |
| 5,264,693 | 11/1993 | Shimabukuro et al. | 250/207 |
| 5,306,904 | 4/1994 | Shimabukuro et al. | 250/207 |
| 5,329,110 | 7/1994 | Shimabukuro et al. | 250/207 |
| 5,360,987 | 11/1994 | Shibib | 257/446 |
| 5,420,432 | 5/1995 | Manook et al. | 250/373 |
| 5,498,863 | 3/1996 | Miller | 257/436 |
| 5,598,014 | 1/1997 | Barany et al. | 257/464 |

OTHER PUBLICATIONS

J.A. Powell et al., "Growth and Characterization of Cubic SiC Single–Crystal Films on Si", *J. Electrochem. Soc.; Solid–State Science and Technology*, vol. 134, pp. 1558–1564 (Jun. 1987).

Jean–Pierre Colinge, "Silicon–on–Insulator Technology: Materials to VLSI", The Kluwer international series in engineering and computer science, Chapter 2 — SOI Materials, including Bibliography (1991).

*Primary Examiner*—Edward P. Westin
*Assistant Examiner*—Kevin Pyo
*Attorney, Agent, or Firm*—Thomas J. Engellenner; John V. Bianco; Lahive & Cockfield, LLP

[57] ABSTRACT

A wavelength selective photodetector including: a substrate having a buried insulator layer for electrically isolating a lower section of the substrate located below the insulator layer from an upper section of the substrate located above the insulator layer; and a photon detector formed on the upper section of the substrate for detecting photons in a selected wavelength range, wherein the upper section has a selected thickness and the thickness determines at least in part the selected wavelength range of the detected photons.

47 Claims, 12 Drawing Sheets

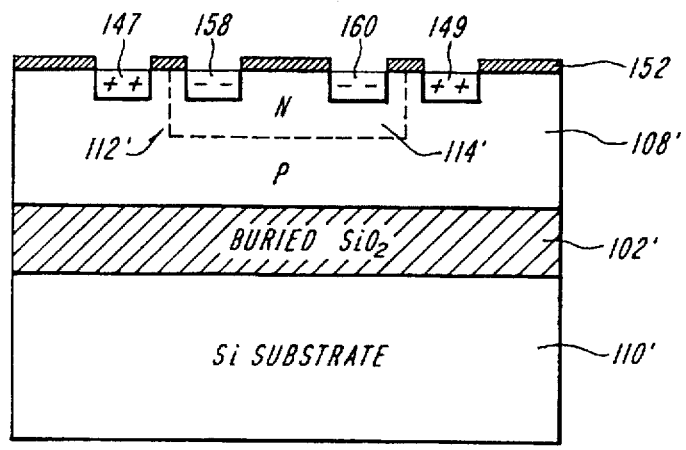
FIG. 5D
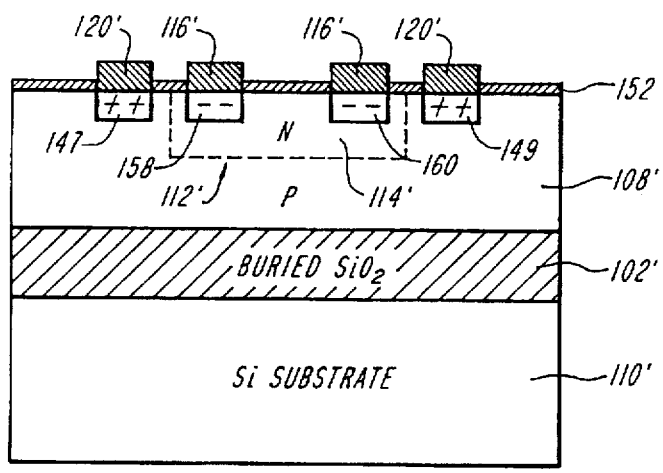
FIG. 5E
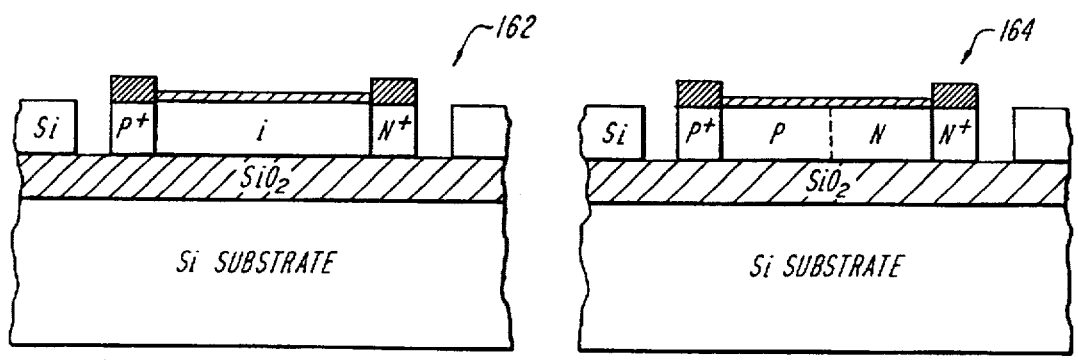
FIG. 6A  FIG. 6B

WAVELENGTH SELECTIVE PHOTODETECTOR

REFERENCE TO RELATED PATENTS

The present application is related to U.S. patent application Ser. No. 08/553,972 entitled "Spectrographic Photodetector Array," assigned to the assignee of the present application and filed on even date herewith, the disclosure of which is incorporated herein by reference.

BACKGROUND OF THE INVENTION

The present invention relates generally to semiconductor photodetectors. More particularly, the invention relates to monolithic wavelength selective photodetectors which implement wavelength selectivity without use of external optical filters. The invention is especially useful for detection of ultraviolet (UV) emissions.

For some time, there has existed a need for improved wavelength selective photodetectors. One particular area where wavelength selectivity is especially desirable is in the field of UV light detection. UV light detectors are useful, for example, in hydrogen and hydrocarbon flame detectors, ozone layer thickness monitors and dosimeters for monitoring harmful UV radiation from the sun.

The need for hydrogen flame detectors arises primarily from NASA extensively employing hydrogen based fuels for its space systems. For such applications, NASA requires efficient and compact hydrogen flame detectors and imagers, which can monitor fuel supply lines and recognize spontaneous combustion of hydrogen in an ambient atmosphere. Hydrogen times emit strongly in the ultraviolet and infrared (IR) bands, with UV emission peaks below 350 nm. Although IR detectors have been used for monitoring hydrogen flames, their performance has been significantly limited due to the presence of overwhelming IR background emissions, from the Sun in daylight and from heat sources other than the hydrogen flame. Consequently, the most promising approach to unattended and fast detection of hydrogen flames is UV emission detection.

Attempts have been made to develop monitoring systems that selectively detect UV emissions from hydrogen flames, without being overwhelmed by background emissions from visible and infrared sources. One such system provides a UV sensitive camera for observing hydrogen flames at 309 nm. That system employs a quartz and CaF achromatic lens coupled to a UV image intensifier. The UV image intensifier fiber-couples to a focus projection scan vidicon. Interference filters select the emission band to be monitored. The filters are designed to discriminate against background visible and IR radiation. Although this detection system performs reasonably well, it suffers from several disadvantages. For example, it is relatively large, complex and expensive to build and maintain. Additionally, as a result of using interference filters, the UV signals being monitored are typically attenuated to about 3%–4% of their original strength.

The need for ozone layer thickness monitors and dosimeters for monitoring harmful UV radiation from the Sun arises primarily from increased awareness of the potentially harms effects of UV light on plant and animal life. Much of the Sun's UV radiation is filtered by the Earth's atmosphere before it reaches the surface of the planet. However, recent changes in atmospheric absorption characteristics, specifically depletion of the ozone layer, allow more UV radiation to reach Earth's surface. The UV spectrum is divided into three regions: UV-A, UV-B and UV-C. UV-B and UV-C radiation is most harms to plants and animals. As a result of ozone layer depletion, it is becoming increasingly necessary to measure and monitor the ozone layer, along with harmful UV radiation levels in populated areas for preventing such ailments as skin cancer and cataracts.

Realizing the above concern, a number of television stations have recently added a new feature to their weather forecast and begun informing the public of the daily danger level from UV exposure. Their data are obtained from the very few available UV monitoring installations. The relatively expensive and complex nature of present monitoring instruments and their limited performance have prevented widespread installation. By way of example, to selectively detect UV emissions while rejecting background from visible and infrared radiation, current instruments either use optical interference filters or a monochromator, in conjunction with the actual sensor, or they employ photodiodes based on wide band gap semiconductors such as GaN or GaP. As discussed above, interference filters are expensive and significantly attenuate the incident UV light. Not only does the monochromator suffer from both of these drawbacks, but it also is a relatively bulky and heavy instrument. The wide band gap periodic table group III–V compound photodiodes, such as GaN and GaP, are expensive to fabricate and cannot be monolithically integrated with Si read out electronics. The high cost and complex operation render the existing devices unsuitable for large commercial markets.

Accordingly, an object of the present invention is to provide a filterless wavelength selective photodetector.

A further object of the invention is to provide a compact inexpensive wavelength selective photodetector.

An additional object of the invention is to provide a compact inexpensive wavelength selective photodetector that is suitable for monitoring UV emissions.

Another object of the invention is to provide a wavelength selective photodetector that is suitable for operation as a flame detector.

A further object of the invention is to provide a wavelength selective photodetector that is suitable for monitoring ozone depletion, or build up.

Other general and specific objects of the invention will in part be obvious and will in part appear hereinafter.

SUMMARY OF THE INVENTION

The foregoing objects are attained by the invention, which provides a wavelength selective photodetector. According to one preferred embodiment of the invention, the photodetector includes a substrate, preferably Si based, having a buried insulator layer, and a photodetection element. The insulator layer is preferably fabricated at a selected depth in the substrate and electrically isolates a lower section of the substrate located below the insulator from an upper section of the substrate located above the insulator. According to various embodiments of the invention, the insulator layer can be constructed from silicon oxide, silicon dioxide, silicon nitride, silicon oxynitride or aluminum oxide. The photodetection element, which is preferably a photodiode, is fabricated on the upper section of the substrate. The selected depth at which the insulator layer is formed determines the thickness of the upper section, and contributes to determining the long wavelength cutoff of the photodetector. The long wavelength cutoff is also affected by the energy band gap of the material from which the top section is fabricated. Thus, according to one embodiment, the upper section is fabricated from Si. According to another embodiment, the upper section is fabricated from SiC. In yet a further embodiment, the upper section is formed as a dual layer structure having a top layer of SiC and a bottom layer of Si. By varying the thickness and/or material composition of the top section, the long wavelength cutoff of the photodetector can be adjusted.

A wavelength selective photodetector according to the invention has a broad range of applications. By way of example, the invention can be employed in hydrogen flame detectors, ozone layer thickness monitors and UV dosimeters for detecting harmful UV solar emissions. In other embodiments, the invention is employed in time-out monitors for aircraft engines, hydrocarbon flame monitors for residential and commercial heating systems and furnaces, safety devices for flammable gas storage facilities, dosimeters for monitoring light during UV curing applications, and various other analytical and clinical instrumentation. Accordingly, it is especially useful to fabricate the invention to be particularly sensitive to UV light, while being insensitive to other wavelengths of light, such as light in the visible and infrared (IR) wavelength ranges.

Thus, a photodetector, according to one preferred embodiment of the invention, has an upper layer that is fabricated from Si and is between about 2000 Å and about 4000 Å thick to detect light in a range between about 300 nm and about 400 nm. According to an alternative embodiment, the upper layer has a thickness of less than about 2000 Å to provide an even lower long wavelength cutoff and thus, reduced sensitivity to light in the IR and visible wavelength ranges.

As mentioned above, according to one preferred embodiment, the photodetection element is a photodiode fabricated on the upper section of the substrate. According to a further embodiment, an implantation mask, which shields the upper layer from incident light, is formed on a portion of the top surface of the upper section. The photodiode is fabricated on a portion of the upper section that is not covered by the implantation mask. The mask can be formed from $Si_3N_4$ or $SiO_2$, and preferably, has a thickness in a range between about 5000 Å and about 10000 Å.

The photodiode can be fabricated from a semiconductor junction between an n-type doped region of the upper section and a p-type doped region of the upper section. According to one embodiment, the n-type doped region is formed on the p-type doped region. According to another embodiment, the p-type doped region is formed on the n-type doped region. In the case where the upper portion of the substrate is Si, the n-type dopant is preferably arsenic (As) and the p-type dopant is preferably boron (B). By way of example, for a Si upper section and an n-on-p structure, the p-type doped region can be doped to have a dopant concentration in a range between about $1\times10^{15}/cm^3$ and about $1\times10^{18}/cm^3$ and the n-type doped region can be doped to have a dopant concentration in a range between about $1\times10^{17}/cm^3$ and about $1\times10^{20}/cm^3$. Alternatively, for a p-on-n structure, the n-type doped region can be doped to have a dopant concentration in a range between about $1\times10^{15}/cm^3$ and about $1\times10^{18}/cm^3$ and the p-type doped region can be doped to have a dopant concentration in a range between about $1\times10^{17}/cm^3$ and about $1\times10^{20}/cm^3$. Preferably, the upper region in either the n-on-p or p-on-n structure has a higher doping concentration than does the lower region. In the case where the upper section is SiC, the p-type dopant is preferably aluminum (Al) or boron (B) and the n-type dopant is preferably nitrogen (N) or phosphorous (P).

According to one embodiment, the upper section is fabricated as a two layer structure. The top layer is SiC and the bottom layer is Si. The photodiode can be formed either as a homojunction, i.e. completely within the SiC layer, or heterojunction, i.e. with the junction formed at the interface of the SiC layer and the Si layer.

In operation, a portion of the light that falls incident on the upper section passes through the semiconductor junction of the photodiode thus, generating a corresponding electrical output signal. The buried insulator preferably reflects photons having wavelengths shorter than the long wavelength cutoff back through the photodiode junction, thus, increasing the quantum efficiency of the photodiode at selected shorter wavelengths. Photons having wavelengths longer than the selected cutoff pass through the buried insulator layer to the lower section of the substrate and are isolated from further contribution to the electrical output signal. The thickness of the upper section of the substrate, along with the energy band gap of the material from which the upper section is fabricated determine the long wavelength cutoff. A photodetector according to the invention preferably includes first and second ohmic contacts for electrically connecting to the photodiode junction for providing access to the electrical output signal.

In a further embodiment of the invention, the photodetector includes an antireflective coating at the surface for reducing reflectance at wavelengths shorter than the long wavelength cutoff. The antireflective coating can be formed, for example, from one or more layers of, SiO, $SiO_2$, ZnS, $Si_3N_4$, $TiO_2$, $Ta_2O$, SiC and/or MgF.

BRIEF DESCRIPTION OF THE DRAWINGS

For a fuller understanding of the nature and objects of the present invention, reference should be made to the following detailed description and the accompanying drawings, in which:

FIGS. 5A–5E depict alternative processing steps for fabricating a wavelength selective photodetector of the type shown in FIG. 1;

FIGS. 6A and 6B show alternative photodiode junction arrangements for the wavelength selective photodetector of FIG. 1;

DETAILED DESCRIPTION

The present invention relates generally to wavelength selective photodetectors. More particularly, the invention relates to solid-state wavelength selective photodetectors which implement wavelength selectivity without use of external optical filters. According to a preferred embodiment, the present invention employs silicon-on-insulator (SOI) structures to realize filterless, wavelength selective detectors which can efficiently detect photons of particular wavelengths, while exhibiting minimum sensitivity to photons of other wavelengths.

Figure 1:
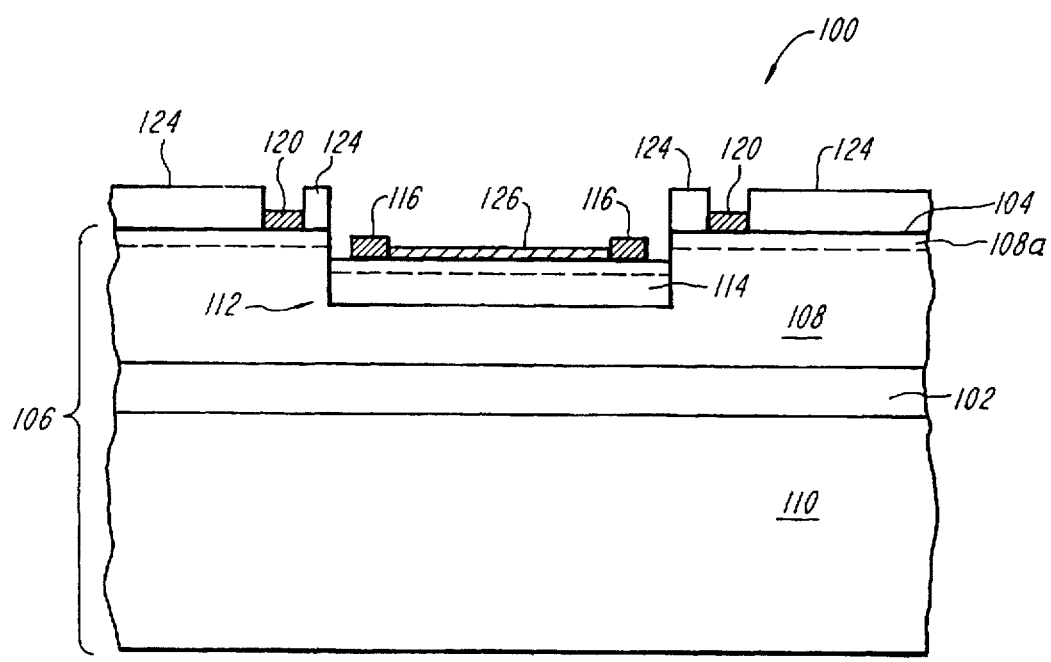
FIG. 1 is a cross sectional view of a wavelength selective photodetector according to one embodiment of the invention.

FIG. 1 shows a cross sectional view of a wavelength selective photodetector 100 according to one embodiment of the invention. The detector 100 includes a buffed insulator layer 102 implanted to a selected depth below the surface 104 of a Si substrate 106. The buried insulator layer 102 divides the Si substrate 106 into a relatively thin upper section 108 and a relatively thick lower section 110. The depth to which the buried layer is implanted determines the thickness of the upper section 108. A photodiode 112 is fabricated on the upper section 108. The upper section 108 is preferably p-type doped. The photodiode 112 includes an n-type doped layer 114 formed on the p-type doped upper section 108. Ohmic contact 116, formed as a ring on the n-type doped layer 114, provides electrical connection to that layer, while ohmic contact 120, formed as a ring on p-type doped section 108, provides electrical connection to that section. An implantation mask 124 is formed on the upper section 108. Optionally, an antireflective (AR) coating 126 for minimizing reflectance in a selected wavelength range is formed on the photodiode 112.

In operation, as photons of light fall incident on the detector 100, they pass through the n-on-p junction of diode 112. As photons pass through the upper semiconducting layers 114 and 108, they generate electron-hole pairs which are separated at the pn junction. As a result, a current is generated across the junction. That current can be sensed between terminal 116 which contacts layer 114, and terminal 120 which contacts upper section 108. Once the incident photons pass through the photodiode 112, they strike insulator 102. Photons having a wavelength greater than a selected long wavelength cutoff pass through the insulator layer 102 and are dissipated within the lower section 110 of substrate 106. Photons having a wavelength less than the selected long wavelength cutoff are preferably reflected by the insulator 102 back through the diode 112. Such reflections act to increase the quantum efficiency of the diode 112 at wavelengths less than the selected long wavelength cutoff and increase the electrical output signal sensed at terminals 116 and 120. According to the invention, the thickness of the upper section 108, along with the energy band gap of the material from which the upper section 108 is fabricated determines the long wavelength cutoff and thus, the quantum efficiency of the photodetector 100 at various wavelengths of light.

Figure 2:
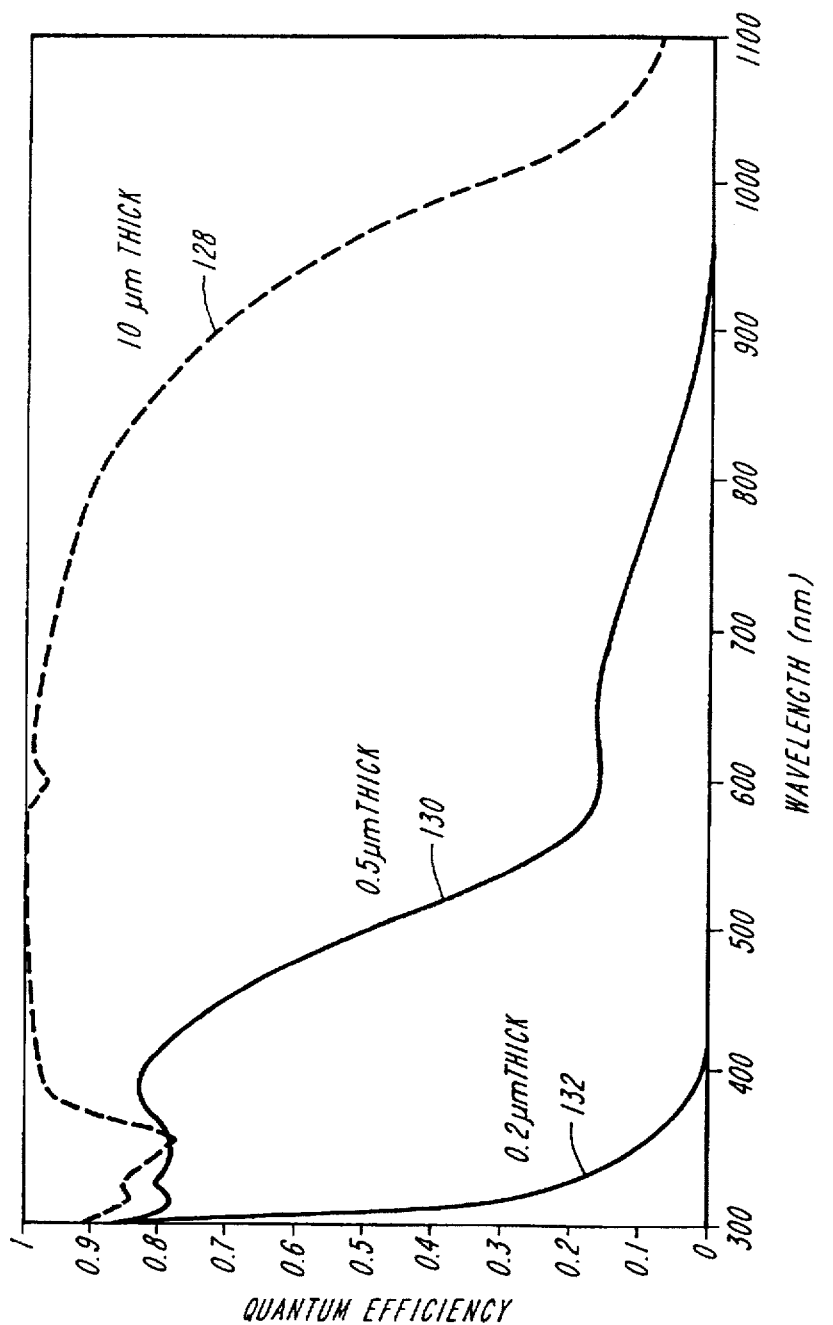
FIG. 2 shows a comparison of quantum efficiency as a function of wavelength between several wavelength selective photodetectors fabricated in accordance with the present invention.

FIG. 2 shows a comparison of spectral quantum efficiencies at various wavelengths between several photodetectors fabricated in accord with the embodiment of FIG. 1, but with differing upper section 108 thicknesses. For example, curve 128 illustrates that an upper section 108 fabricated from Si and having a thickness of 10 μm provides a long wavelength cutoff in the approximate range of 900 nm–1000 nm (near infrared or NIR). Alternatively, curve 130 shows that an upper section 108 fabricated from Si and having a thickness of 5000 Å provides a long wavelength cutoff in the approximate range of 500 nm–600 nm (visible). As shown by curve 132, an upper section 108 fabricated from Si and having a thickness of less than 2000 Å provides a long wavelength cutoff of less than about 400 nm (UV).

Figure 3:
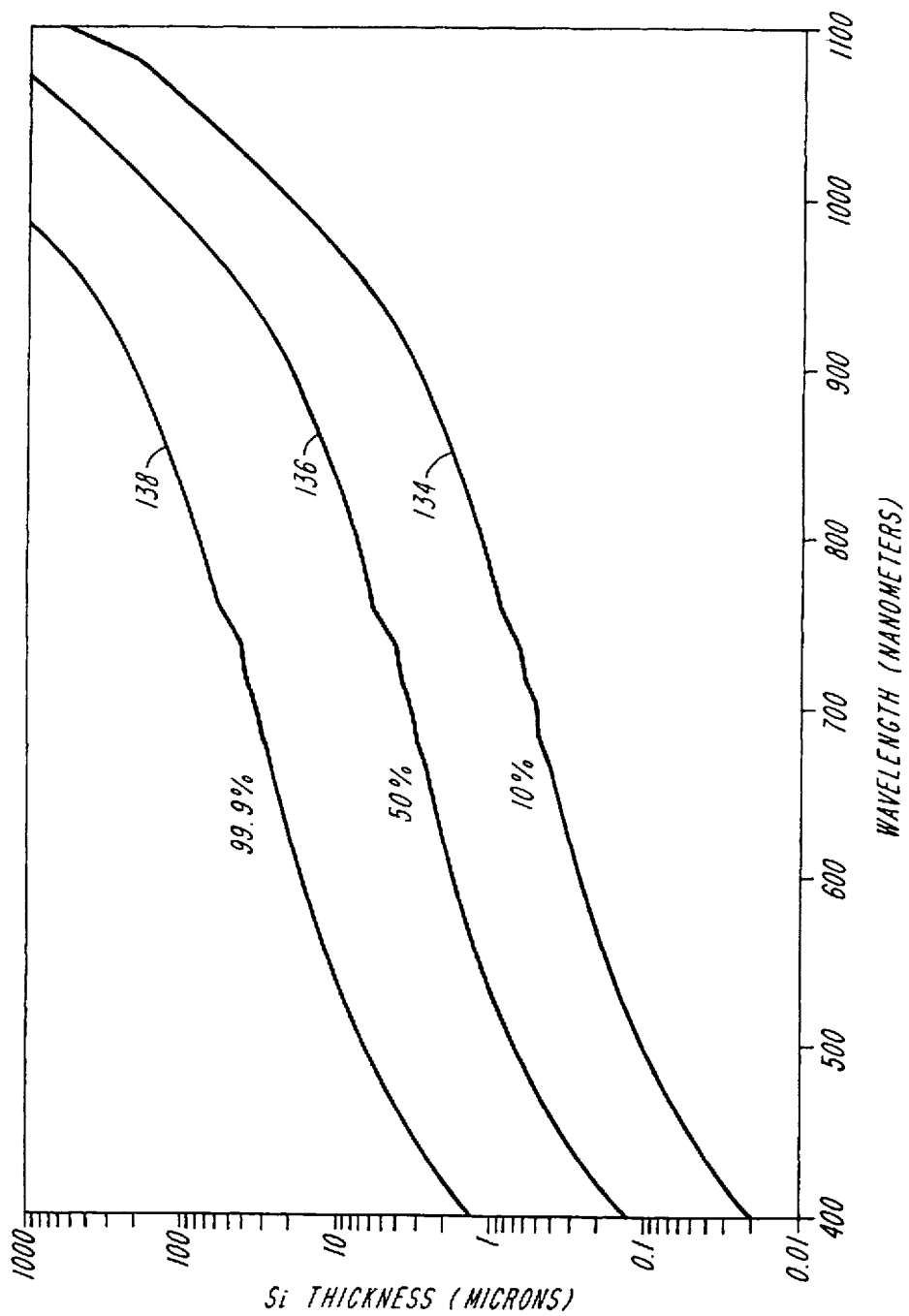
FIG. 3 depicts the relationship between the thickness of silicon and the wavelength of light that it absorbs.

FIG. 3 shows a series of curves 134, 136 and 138 indicating the thickness of Si required to absorb differing percentages of incident light. As can be seen, an upper section 108 having a thickness of approximately 500 nm will absorb between 50% and 99.9% of the incident light having a wavelength less than 400 nm (see curve 138). Alternatively, it will absorb less than 50% of the incident light having a wavelength greater than about 475 nm (see curve 136) and less than 10% of the incident light having a wavelength greater than about 675 nm (see curve 134). Based on the data of FIGS. 2 and 3, a wavelength selective photodetector of the type depicted in FIG. 1 and having a Si upper section 108 with a thickness of about 500 Å would be quite sensitive in the UV wavelength range, while having insignificant visible and IR sensitivity.

Figure 4A:
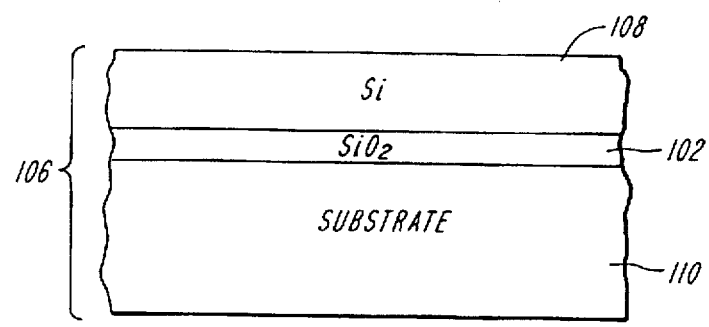
FIGS. 4A–4F depict abridged processing steps for fabricating a wavelength selective photodetector of the type shown in FIG. 1.

FIGS. 4A–4F illustrate one preferred process by which a wavelength selective photodetector of the type depicted in FIG. 1 can be fabricated. Like components shown in FIG. 1 and FIGS. 4A–4F are depicted with like reference designations. As illustrated in FIG. 4A, a buried insulator 102 is formed at a predetermined depth in a Si substrate 106. The buried insulator layer 102 divides the substrate 106 into an upper section 108 and a lower section 110. The buried insulator layer 102 is preferably formed by a separation by implantation of oxygen (SIMOX) process. However, other SOI materials can also be used to fabricate the devices of the invention. Such other materials include, but are not limited to, bonded and etch-back SOI (BESOI) substrates, zone-melting recrystallization (ZMR) substrates, and silicon on sapphire (SOS) substrates.

SIMOX devices have the advantage of being inherently radiation hard, and thus are suitable for space applications. More specifically, SIMOX detectors have superior resistance against damage from protons and alpha particles. After irradiation with a proton fluence of $1 \times 10^{11}$ p/cm$^2$ at 1.45 MeV, significant degradation in the performance of bulk Si devices occurs, while SIMOX devices are substantially unaffected. Additionally, the increase in dark leakage current of bulk Si devices, after irradiation with an alpha fluence of $8 \times 10^{11}$ α/cm$^2$, is about ten times greater than that which occurs in SIMOX counterparts.

According to the invention, a plurality of SIMOX processes can be employed to fabricate the buried insulator layer 102. Examples of those processes include high dose, high energy, single implant SIMOX; high dose, high energy, multiple implant SIMOX; and low dose, low energy implant SIMOX. In the high dose, high energy, single implant process, the substrate 108 is implanted with a dose of $1.8 \times 10^{18}$ O$^+$/cm$^2$ at an energy of 200 KeV, followed by annealing for six hours at approximately 1300° C. in nitrogen (N$_2$). The resulting SIMOX structure has a Si top section 108 having a thickness of about 2000 Å and a buried SiO$_2$ insulator layer 102 having a thickness of about 4000 Å. Such a structure yields a relatively low response to visible and IR photons, while efficiently detecting UV photons having wavelengths near 310 nm. Additionally, the Si top section 108 can be increased by growing additional Si epitaxially by chemical vapor deposition (CVD), or decreased by thermal oxidation of the layer, followed by etching in buffered HF.

In the high dose, high energy, multiple implant process, instead of a single high dose oxygen implantation, three smaller oxygen doses, typically of 0.5, 0.5, and $0.8 \times 10^{18}$ $O^+/cm^2$ are implanted sequentially into the substrate 106, followed by a high temperature anneal (typically at 1300° C. in $N_2$) after each implantation step. A primary advantage of the multiple implant process is that it usually yields a Si top section 108 with a lower threading dislocation density and a buried oxide layer of better quality than the single implant process. However, due to the additional processing, it is more expensive.

In the low energy SIMOX (LES) process, an oxygen dose of about 0.4 to $0.7 \times 10^{18}$ $O^+/cm^2$ is implanted at an energy of between about 20 KeV and about 80 KeV to form an SOI structure with a Si top section 108 thickness on the order of about 200 Å to about 1000 Å. Low dose, low energy implantation is more cost effective than high dose, high energy SIMOX processes and offers some technical advantages. It is more cost effective than other SIMOX processes because implantation time is reduced and also because low energy ion implanters are less expensive than high energy models. One technical advantage is that the low dose implantation creates less damage to the original substrate 106 and thus, can produce a higher quality top section 108.

Figure 4B:
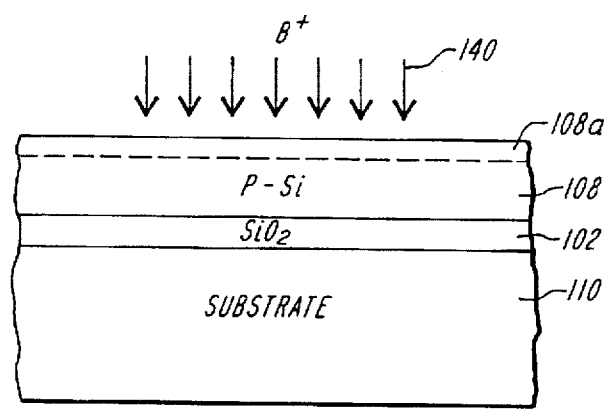

As shown in FIG. 4B, subsequent to preparing the substrate 106 in accord with the particular SIMOX process of FIG. 4A, it is implanted with a dose of boron (B) atoms 140 of approximately $2 \times 10^{13}$ $B^+/cm^2$ at about 30 KeV to render the Si top section 108 p-type. The substrate 106 is then annealed for twenty-five minutes at 900° C. in $N_2$ to recrystallize the Si upper section 108 and to activate the p-type dopant. The implantation followed by annealing process yields an upper section 108 having a highly p-type doped top section 108a.

Figure 4C:
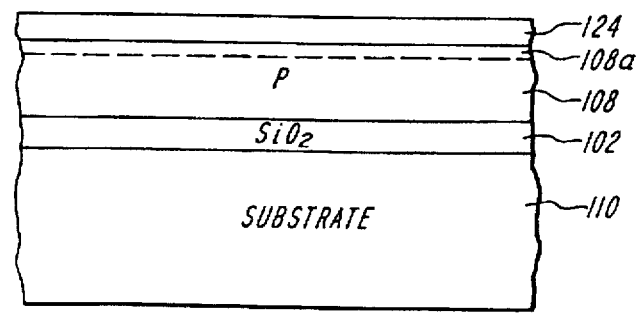
Figure 4D:
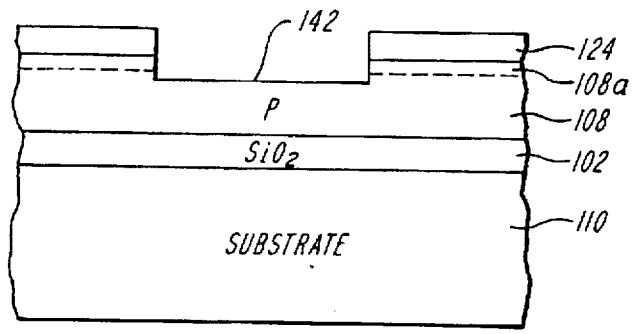
Figure 4E:
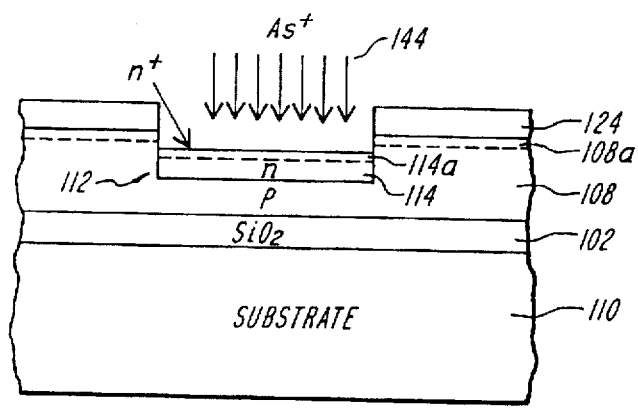

Next, as shown in FIG. 4C, a layer 124 of $Si_3N_4$ about 6000 Å thick is deposited as an implantation mask onto the substrate 106. Preferably, the mask 124 is deposited using ion beam assisted deposition (IBAD). As shown in FIG. 4D, the substrate 106 is then patterned using standard photolithographic techniques to remove mask 124 and highly p-type doped top portion 108a from a selected region 142 to expose the p-type doped Si upper section 108. As illustrated in FIG. 4E, the photodiode 112 is then fabricated by forming a shallow n-on-p junction between upper section 108 and layer 114 by implanting arsenic (As) ions 144 at a dose of $1 \times 10^{15}$ $As^+/cm^2$ at 40 KeV. Following implantation, the substrate 106 is annealed at 950° C. for thirty minutes in $N_2$, again to recrystallize the material and activate the dopants. The semiconductor junction between layer 114 and section 108 is preferably located less than 500 Å below the surface of upper section 108. The implantation followed by annealing process yields an n-type doped layer 114 having a highly n-type doped top portion 114a. In addition, an $SiO_2$ layer about 100 Å thick is grown thermally to passivate the surface.

Figure 4F:
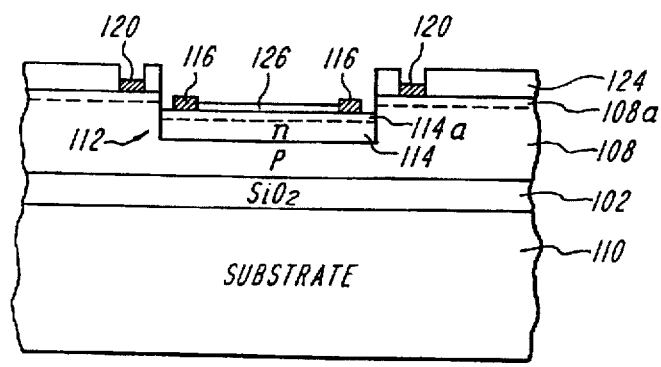

During fabrication, the formation of the n-on-p junction of the photodiode 112 can be verified by techniques such as hot-point probing, four-point probing and staining of the semiconductor junction. Following verification of the formation of the semiconductor junction, and as shown in FIG. 4F, the substrate 106 is patterned photolithographically a second time and windows to the ohmic contact regions 114a and 108a are opened. Using an e-beam evaporator, the contacts 116 and 120 are formed by initially depositing a Ti layer about 500 Å thick, followed by 500 Å of Pd, followed by 5000 Å of Au on the ohmic contact regions. The use of Ti insures adhesion to the Si, while the Au layer on top provides ideal oxidation-resistant contact pads for bonding. Pd is used as a bridge between the Au and Ti.

According to a further embodiment of the invention, and as shown in FIGS. 1 and 4F, the photodetector 100 can include an anti-reflection (AR) coating 126 to minimize reflection loss and to improve the detector's responsivity in the desired wavelength range. In the case of a UV selective photodetector 100, an AR coating 126 which minimizes the reflectance for photons having wavelengths shorter than 350 nm can be selected. In selecting an appropriate AR coating 126, competing factors should be weighed. By way of example, for a UV selective detector 100, the AR coating 126 should reduce the amount of light reflected from the detector at wavelengths shorter than 350 nm, but should not have an energy band gap so small that it absorbs a significant portion of the UV photons, before they reach the photodiode 112.

More specifically, testing has shown that a UV selective detector with a 2000 Å thick Si upper section 108 and a 4000 Å thick buried $SiO_2$ layer 102 on a Si substrate 110, without any AR coating, reflects over 60% of the incident light having wavelengths less than 350 nm. However, an AR coating 126 of a 500 Å thick layer of $SiO_2$ provides a reduction in reflectance of UV photons of about a factor of two. In contrast, an AR coating 126 formed from a 314 Å thick layer of $Si_3N_4$ reduces the reflectance at UV wavelengths to less than 10%. Alternatively, a 314 Å thick layer of ZnS reduces the reflectance at UV wavelengths to almost zero. However, because the energy band gap of ZnS is relatively small (about 3.7 eV) as compared to $Si_3N_4$ (about 5 eV) and $SiO_2$ (about 9 eV), much of the incident UV light is absorbed by a ZnS layer before it reaches the photodiode 112.

Consequently, according to one embodiment of a UV selective photodetector according to the invention, the AR coating 126 is fabricated from a double layer consisting of a 240 Å thick layer of $Si_3N_4$ on a 75 Å thick layer of $SiO_2$. Such a structure provides a reflectance at UV wavelengths of less than 10%, while not absorbing a significant amount of the incident light. Preferably, the $SiO_2$ layer is grown thermally on layer 114 by dry oxidation in a tube furnace, followed by deposition of the $Si_3N_4$ layer using plasma assisted chemical vapor deposition (PA-CVD). However, according to further embodiments, AR coatings formed from one or more layers SiO, $SiO_2$, ZnS, $Si_3N_4$, $TiO_2$, $Ta_2O_5$, SiC and/or MgF can be employed.

FIGS. 5A–5E depict an alternative process for fabricating a wavelength selective photodetector 100 according to the invention. Elements in FIGS. 5A–5E which have counterpart elements in FIGS. 4A–4F are denoted with a prime (') in those figures. As in the case of the process of FIG. 4A, a SIMOX process is employed in FIG. 5A to form a buried $SiO_2$ insulator layer 102' in a substrate 106'. However, prior to implanting the boron ions 140' to render the upper section 108' p-type doped, a thin ion implantation mask 124' of $SiO_2$ about 1500 Å thick is deposited by CVD or grown thermally. Using photolithographic steps, windows are opened in the mask 124' in the ohmic contact regions 146 and 148. Initially, a relatively low dose of boron ($5 \times 10^{12}$ $B^+/cm^2$) is implanted at an energy of about 60 KeV. Under this condition, the boron ions are distributed well within the upper section 108', with the peak concentration near the buried $SiO_2$ interface, while the Si near the surface is very lightly doped. Next, preferably without removing the substrate 106' from the implanter, the ion implantation energy is reduced to 10 KeV and implantation is continued with a higher dose of boron ($5 \times 10^{13}$ $B^+$/$cm^2$). Due to the low implantation energy, the distribution profile of the second implant is shallow (about 800 Å) and dopes the ohmic contact regions 147 and 149, which have been exposed through the mask 124', forming highly-doped $p^+$ regions ideal for low-resistance ohmic contact formation. After boron implantation, the masking 124' is removed and the substrate 106' is prepared for formation of n-type doped layer 114', shown in FIG. 5C.

Figure 5A:
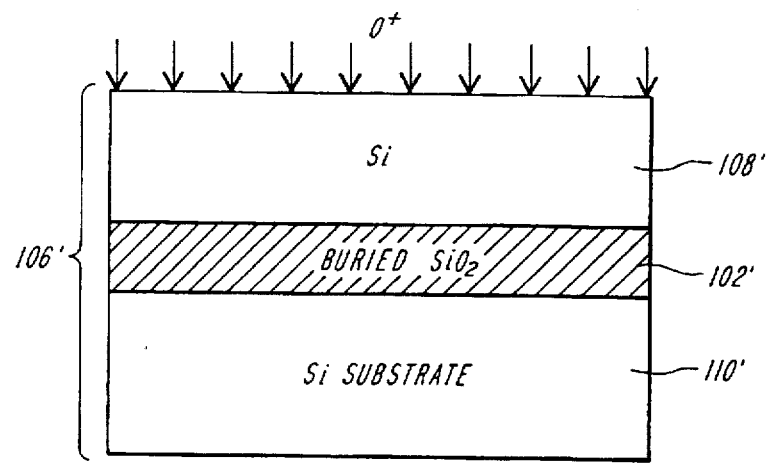
Figure 5B:
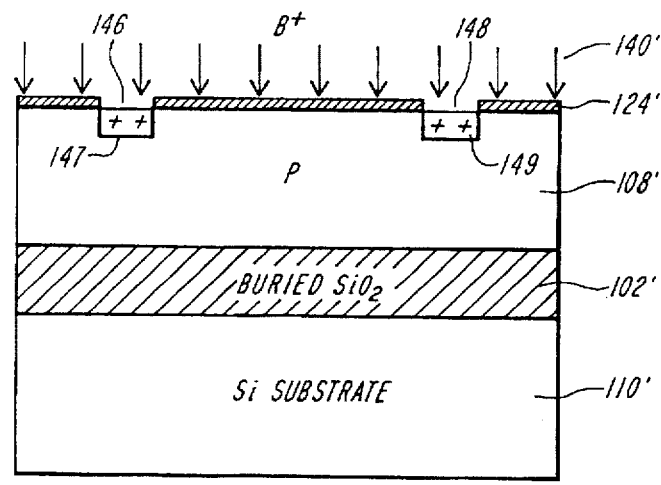
Figure 5C:
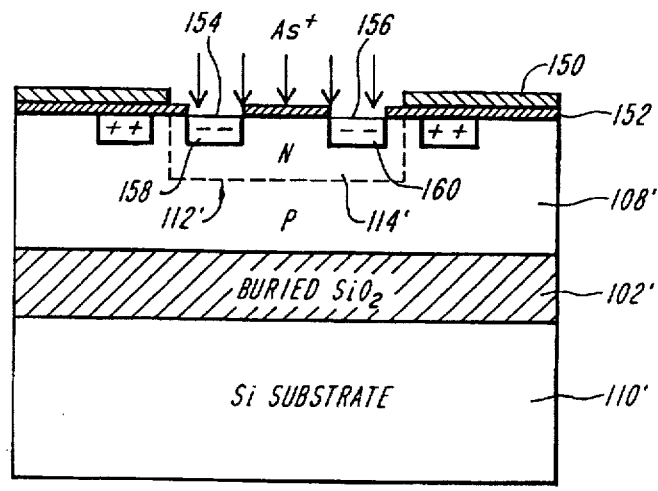

With further reference to FIG. 5C, the substrate 106' is masked with a relatively thick layer 150 of $SiO_2$ (>5000 Å thick) to mask the outside portion of the p-type upper section 108', which surrounds the active region of the photodiode 112'. A thinner (about 200 Å) layer 152 of $SiO_2$, with opened windows 154 and 156 is formed over the active region 112'. Arsenic donor ions are initially implanted with a dose of about $5 \times 10^{14}$ $As^+$/$cm^2$ at 40 KeV. Accordingly, the distribution range of this implant is only about 550 Å (200 Å in the masking oxide) with a peak about 150 Å below the surface of section 108' in the area 114'. After the formation of the n-well 114', the implantation energy is reduced to 15 KeV and a dose of $1 \times 10^{15}$ $As^+$/$cm^2$ is implanted to form highly-doped $n^+$regions 158 and 160 for ohmic contacts.

Following implantation, the mask 150 is removed. However, the mask 152 can be left as a passivating layer to improve device performance. Additionally, metal contacts 116' and 120' can be formed in the same way, described above with respect to FIGS. 4A–4F. An AR coating of the type described above can also be included.

FIGS. 6A and 6B depict wavelength selective photodetectors 162 and 164, respectively, having alternative photodiode junction configurations. More particularly, in the embodiments of FIGS. 1, 4A–4F and 5A–5E, the photodiodes 112 and 112' have a vertical n-on-p junction configuration. Alternatively, FIG. 6A depicts a p-intrinsic-n (PIN) horizontal junction and FIG. 6B depicts a $p^+pnn^+$ horizontal junction. However, according to a preferred embodiment, a vertical junction of the type depicted in FIGS. 1, 4A–4F and 5A–5E is employed by the invention.

Figure 7:
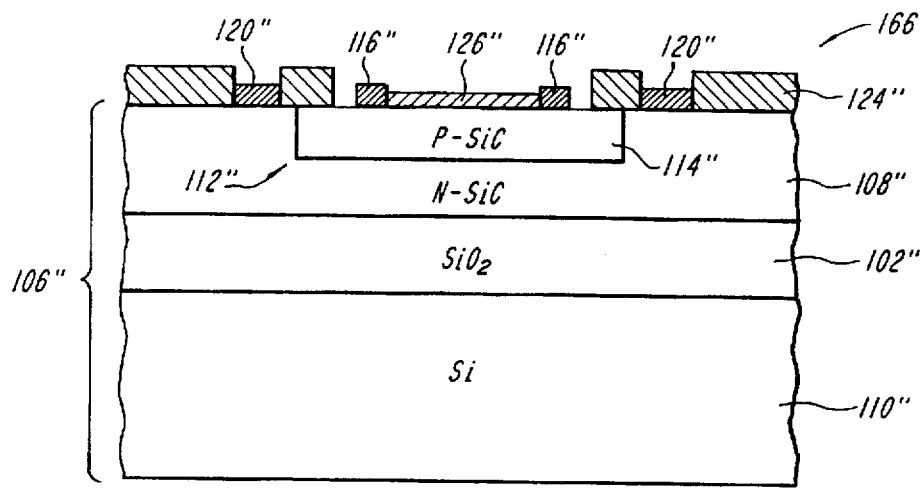
FIG. 7 is a cross sectional view of an alternative embodiment of the invention employing SiC in the upper section of the wavelength selective photodetector of FIG. 1.

FIG. 7 shows a cross sectional view of a wavelength selective photodetector 166, which employs an upper section 108" of SiC according to an alternative embodiment of the invention. As discussed above, two important factors in determining the long wavelength cutoff is the thickness of the upper section 108" and the energy band gap of the material from which it is formed. More particularly, the energy band gap of the top section material determines the maximum thickness of the top section 108" for any particular long wavelength cutoff. For example, as illustrated in FIG. 2, to achieve a long wavelength cutoff in the approximate range of 500 nm–600 nm with Si the top layer should be less than about 5000 Å thick (see curve 130). However, since the energy band gap of SiC (2.2 eV) is twice that of Si (1.1 eV), a SiC top layer that achieves the same long wavelength cutoff can expectedly be considerably thicker. As a result of the increased top section thickness, a photodetector with a particular long wavelength cutoff is easier to fabricate with a thick SiC top section rather than with a thin Si top section.

As can be seen, the photodetector 166 of FIG. 7 is constructed in a similar fashion to the photodetector 100 of FIG. 1. Accordingly, elements in FIG. 7 which have counterpart elements in FIG. 1 are denoted with a double prime ("). By way of example, the detector 166 includes a buried insulator layer 102", preferably formed from $SiO_2$, which divides the substrate 106" into a relatively thin upper section 108" formed of SiC and a relatively thick lower section 110" formed of Si. The depth to which the buried layer is implanted determines the thickness of the upper section 108". A photodiode 112" is fabricated on the upper section 108". Unlike the device of FIG. 1, the depicted upper section 108" is n-type doped and the photodiode 112" has a p-type doped layer 114" formed on the n-type doped upper section 108". However, according to an alternate embodiment, the photodiode 112" can be fabricated as an n-on-p device. Accordingly to that embodiment, the n-type dopant is preferably phosphorous or nitrogen and the p-type dopant is preferably aluminum or boron. Ohmic contact 116" provides electrical connection to the p-type doped layer 114", while ohmic contact 120" provides electrical connection to the n-type doped section 108". An implantation mask 124" is formed on the upper section 108". Optionally, an antireflective (AR) coating 126" for minimizing reflectance in a selected wavelength range is formed on the photodiode 112".

Figure 8A:
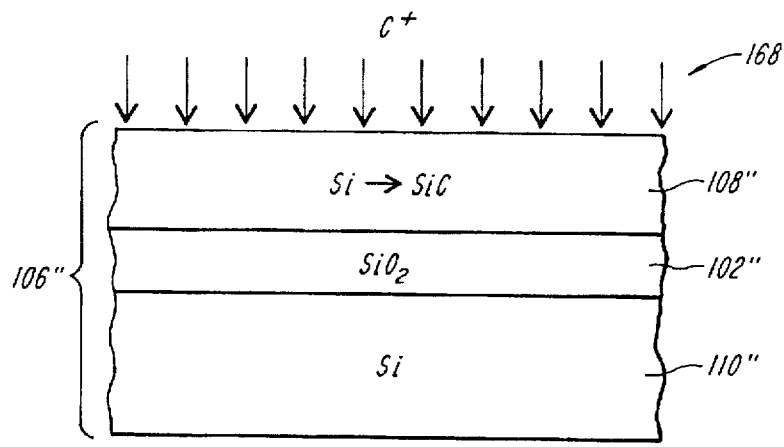
FIGS. 8A–8D depict abridged processing steps for fabricating a wavelength selective photodetector of the type shown in FIG. 7.
Figure 8B:
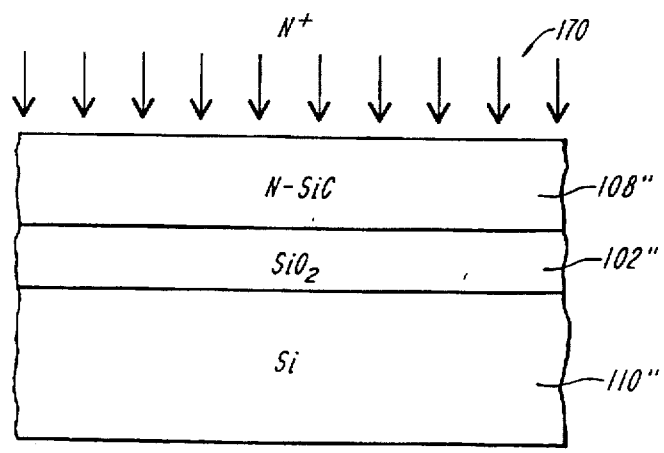
Figure 8C:
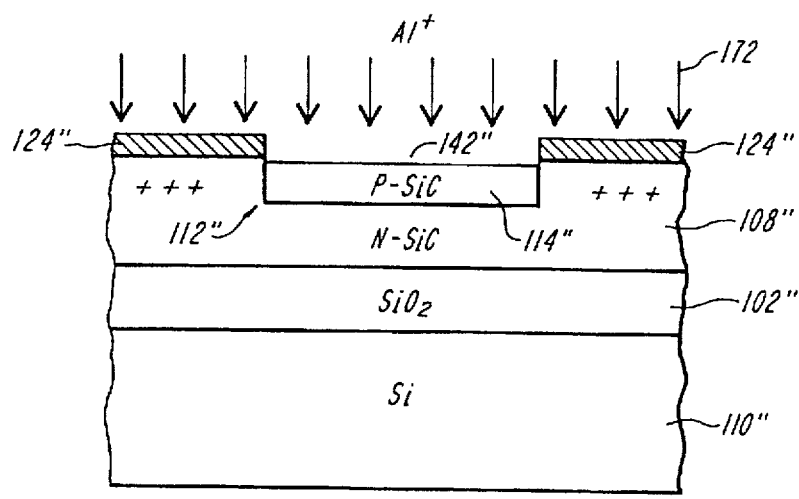
Figure 8D:
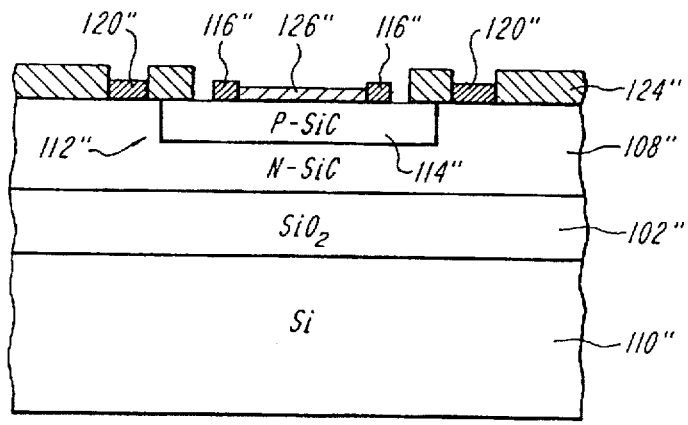

FIGS. 8A–8D depict an abridged process for fabricating a wavelength selective photodetector 166 of the type shown in FIG. 7. As shown in FIG. 8C, buried insulator layer 102" is formed in substrate 106" in the same fashion as insulator 102 of FIG. 4C is formed in substrate 106. Following formation of insulator layer 102", carbon (C) 168 is implanted into the Si upper section 108" to transform it into a SiC upper section. Carbon doses range from about $5 \times 10^{17}$ $C^+$/$cm^2$ to about $2 \times 10^{18}$ $C^+$/$cm^2$ at multiple energies of 25, 50, 75 and 100 KeV, to create a substantially uniform ion distribution profile across the upper section 108". To ensure formation of SiC at the surface, the $C^+$ ions are implanted at a shallow angle up to about 14° from the normal. Following carbon implantation, the substrate 106" is annealed at a temperature of about 1300° C. in flowing $N_2$ for period of between one and ten hours. This solid-phase-epitaxy (SPE) regrowth acts to remove any implantation-induced damage and forms a continuous crystalline SiC layer 108". At these elevated temperatures, the buried amorphous $SiO_2$ layer 102" softens slightly. Such softening is beneficial in accommodating the strain resulting from lattice mismatch between SiC and Si, and thus preventing the nucleation of defects at the interface between section 108" and layer 102". The SiC upper layer may also be formed by means other than carbon implantation. One of the well-known methods of doing this is by carbonizing a Si layer at high temperature by passing a carbon-containing gas over it, or by chemical vapor deposition.

As shown in FIG. 8B, by implanting nitrogen donor ions 170 and annealing, the SiC upper section 108" is n-type doped. Following the n-type doping, as shown in FIG. 8C; an implantation mask 124" of $SiO_2$ having a thickness of about 3000 Å to about 5000 Å is deposited on upper section 108" by CVD. Next, the device is photolithographically patterned and a window 142" is opened in layer 124" by buffered-HF etching. The upper section 108" is then implanted with aluminum (Al) acceptor ions 172 to form a p-type doped SiC well 114" in the area exposed by window 142". Subsequently, the device is annealed for about thirty minutes at about 900° C. to remove implantation damage and to activate the dopants. Once again, the device is photolithographically patterned to open ohmic contact regions to the p-type 114" and n-type 108" SiC regions. Using e-beam evaporation, 500 Å of Ti, 500 Å of Pd, followed by 5000 Å of Ag is deposited in the ohmic contact regions in the same fashion as in FIG. 4F. An AR coating 126" of the type discussed with respect to FIG. 4F can also be employed.

Figure 9A:
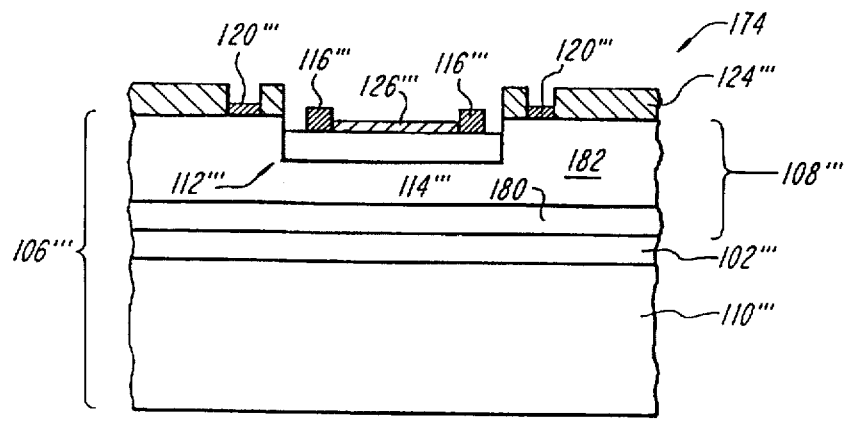
FIGS. 9A–9C are cross sectional views of an alternative embodiment of the invention employing a dual layer structure in the upper section of the wavelength selective photodetector of FIG. 1.
Figure 9B:
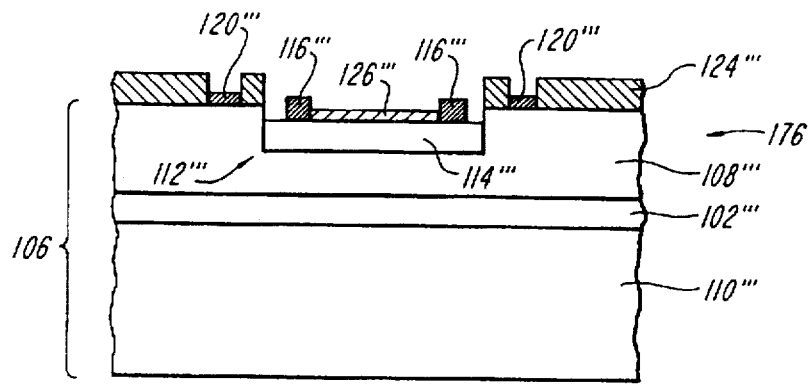
Figure 9C:
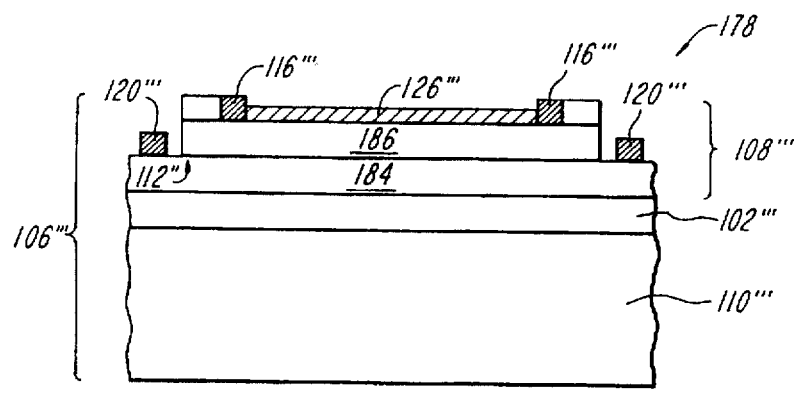

FIGS. 9A–9C depict alternative embodiments of the invention, in which the upper section 108 of FIG. 1 is fabricated as a dual layer structure. Elements in FIGS. 9A–9C which have counterpart elements in FIG. 1 are denoted with a triple prime ('''). By way of example, FIGS. 9A–9C show cross sectional views of a wavelength selective photodetector 174, 176 and 178, respectively. As in the case of detector 100 of FIG. 1, detectors 174, 176 and 178 have a buried insulator layer 102''', preferably of SiO$_2$, formed at a selected depth within a substrate 106'''. The buried layer 102''' divides the substrate into an upper section 108''' and lower section 110'''. However unlike the detector 100 of FIG. 1, the detectors 174, 176 and 178 all employ a dual composition upper section 108'''.

By way of example, upper section 108''' of detector 174 has a bottom layer 180, preferably of Si, and a top layer 182, preferably of SiC. In one preferred embodiment, the SiC layer 182 is between about 250 Å and about 2000 Å thick, and the Si layer 180 is between about 100 Å and about 1000 Å thick. As in the case of photodetector 166 of FIG. 7, the SiC layer 182 is preferably n-type doped with N. The photodiode 112''' is formed as a homojunction within the SiC layer 182. Thus, photodiode 112''' has a p-type doped layer 114''' (preferably doped with aluminum) formed on the n-type doped layer 182. Ohmic contacts 116''' provides electrical connection to the p-type doped layer 114''', while ohmic contacts 120''' provides electrical connection to the n-type doped section 182. An implantation mask 124''' is formed on the top layer 182. Optionally, an antireflective (AR) coating 126''' for minimizing reflectance in a selected wavelength range is formed on the photodiode 112'''.

In contrast to the photodiode of FIG. 9A, the photodiodes 112''' of FIGS. 9B and 9C are fabricated as a heterojunctions. For example, in FIG. 9B, upper section 108''' is formed from Si and layer 114''' is formed from SiC. The junction formed between layer 114''' and section 108''' can be fabricated to be either n-on-p or p-on-n. Electrical connection to the layer 114''' and section 108''' is achieved through contacts 116''' and 120''', as described with respect to FIG. 1. FIG. 9C shows an alliterative construction for achieving a heterojunction in which the upper section 108''' includes a bottom layer 184, preferably of Si, and a top layer 186, preferably of SiC. The top layer 186 can be etched away at the periphery to provide for ohmic contact 120'''. Alternatively, layer 186 can be fabricated as an island on layer 184. As in the case of the embodiment of FIG. 9B, the photodiode 112''' can either be formed with an n-on-p or a p-on-n semiconductor junction.

Figure 10:
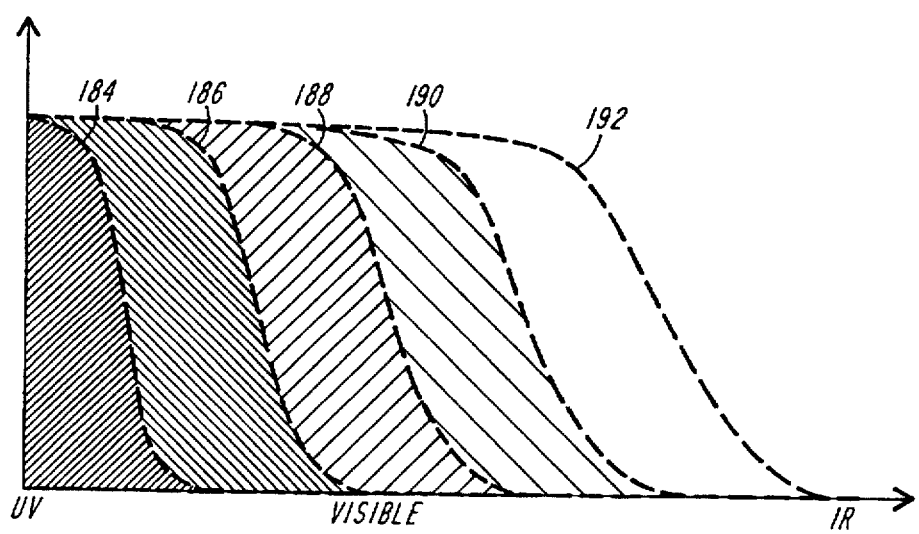
FIG. 10 is a graph representative of the integrated spectral response of an array of wavelength selective photodetectors.

In a further embodiment of the invention, a plurality of wavelength selective photodetectors, of the type discussed above, but having different long wavelength cutoffs can be combined to form a photodetector array. FIG. 10 depicts an integrated spectral response, including exemplary long wavelength cutoff curves 184–192 for five photodetectors included in such an array.

Figure 11:
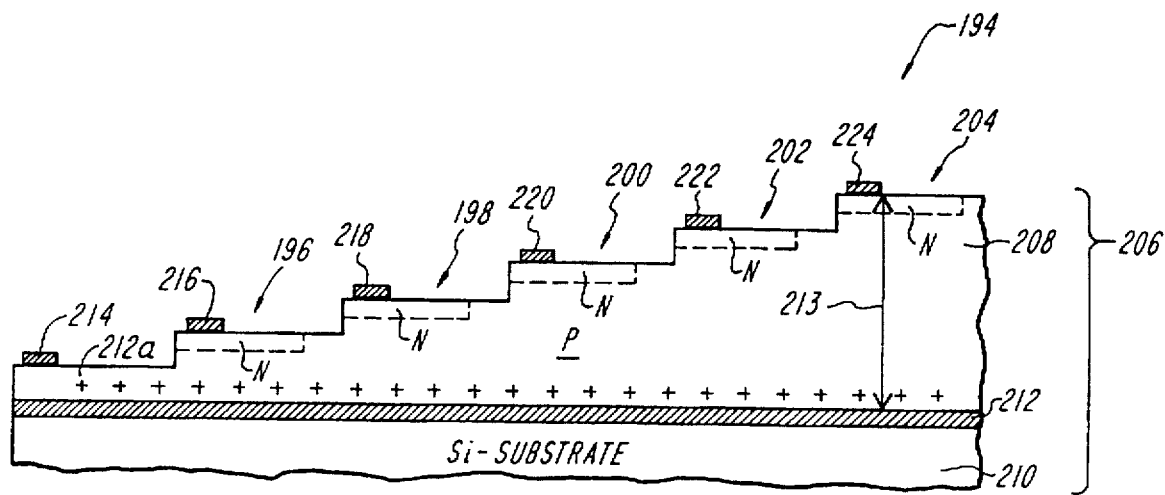
FIG. 11 is conceptual schematic of an array of photodetectors according to an alternative embodiment of the invention.

FIG. 11 shows a conceptual schematic of a filterless and gratingless photodetector array 194 having a spectral response of the type depicted in FIG. 10. As can be seen, the array 194 includes five wavelength selective photodetectors 196–204 with varying long wavelength cutoffs. As in the case of the photodetectors discussed above, each of the detectors 196–204 include photodiodes formed on a substrate 206, wherein the substrate is divided into a relatively thin upper section 208 and a relatively thick lower section 210 by an insulator layer 212. According to a preferred embodiment of the invention, the wavelength selectivity of the photodetectors 196–204 is realized by varying the thickness 213 and/or material composition of the top section 208. According to a further embodiment, a logic circuit or processor can be fabricated monolithically with the array for deconvolving electrical output signals from electrical output terminals 214–224 of the array 194 to identify particular wavelengths of incident photons.

According to one preferred embodiment of the invention, the array 194 is fabricated as a three detector array. A first photodetector in the array detects UV photons up to about 400 nm. A second photodetector detects UV and visible photons having a wavelength shorter than about 600 nm, while being relatively insensitive to IR photons. The third detector detects UV, visible and near IR photons with wavelengths up to about 800 nm. Preferably, the three detectors in the array are configured as n-on-p photodiodes, with differing upper section thickness.

FIGS. 12A–12D depict abridged processing steps for fabricating an array of photodetectors such as that conceptually shown in FIG. 11. Elements in FIGS. 12A–12D which have counterpart elements in FIG. 11 are denoted with a prime ('). By way of example, according to the embodiment of FIG. 12A, a SIMOX process is employed to form a buried insulator layer 212' in a substrate 206'. The insulator layer 212' divides the substrate 206' into a relatively thin upper section 208' and a relatively thick lower section 210'. According to one embodiment, the upper section 208' is fabricated to be about 2000 Å thick and is separated from the lower section 210' by an SiO$_2$ insulating layer 212' having a thickness of about 4000 Å. This structure is produced, preferably by implanting a total oxygen dose of about $1.8\times10^{18}$ O$^+$/cm$^2$ at an energy of 200 KeV into Si(100) substrates, followed by a six hour anneal at about 1300° C. in N$_2$ or argon ambient.

As discussed above, a three element photodiode array in which one detector 196' senses wavelengths below about 400 nm (UV), while the other two detectors 198' and 200' have long wavelength cutoffs at about 600 nm (visible) and at 800 nm (near IR) is fabricated on the above formed SOI structure. However, the 2000 Å thick Si upper section 208' is too thin for absorbing visible or near IR photons. Thus, according to the invention, the thickness of a portion of the upper section can be increased by growing epitaxially between about 1 µm and 20 µm of additional Si by chemical vapor deposition (CVD). To grow high quality Si epitaxial layers, the surface of section 208' is cleaned using a hydrogen bake at a temperature of about 1000° C. Next, Si is deposited onto section 208' from a source gas, such as silane (SiH$_4$), at a temperature near 1100° C., with a growth rate of about 0.7µ m/minute. During the growth process, the Si is doped with boron, using diborane (B$_2$H$_6$) gas, to render the upper section 208' p-type. The desired doping profile forms a very thin ($\approx$1000 Å) highly doped ($>1\times10^{18}$ B$^+$/cm$^3$) Si layer 208a' near the buried oxide layer 212', which can be used as the common contact for all of the photodiodes of the array. In contrast, the upper portion of the upper section 208' is a moderately doped p-type material with a carrier concentration of about $1\times10^{15}$ B$^+$/cm$^3$.

Figure 12A:
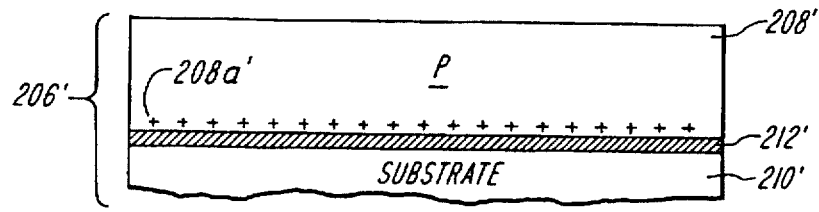
FIGS. 12A–12D depict abridged processing steps for fabricating an array of photodetectors such as that conceptually shown in FIG. 11.
Figure 12B:
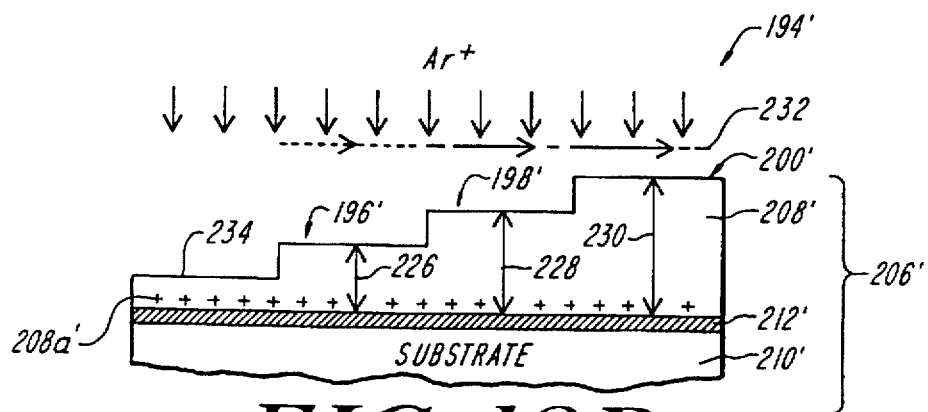

As shown in FIG. 12B, once the p-type Si layer is grown, the substrate 206' is prepared for selective area etching using an RF sputtering machine to define the upper section thickness 226, 228 and 230 for each detector 196', 198' and 200' included in the array 194'. To realize the particular thicknesses 225–230, the upper section 208' is etched anisotropically in an argon ion plasma. Though, for a faster sputtering rate, a reactive ion plasma such as $C_2F_6$ can be used. A physical mask 232 defines the thickness profile, i.e., thicknesses 226–230 for the photodetector array 194'. First, a portion 234 of the upper layer 208' is etched down to the ohmic contact region 208a'. Next, the mask 232 is moved and each of the thicknesses 226–230 are etched. According to a preferred embodiment, thickness 226 is between about 500 Å and about 2000 Å thick, thickness 228 is between about 3000 Å and about 6000 Å thick, and thickness 228 is between 7000 Å and about 10000 Å thick. According to further embodiments, as the desired long wavelength cutoff increases, the thickness 228 is increased.

Figure 12C:
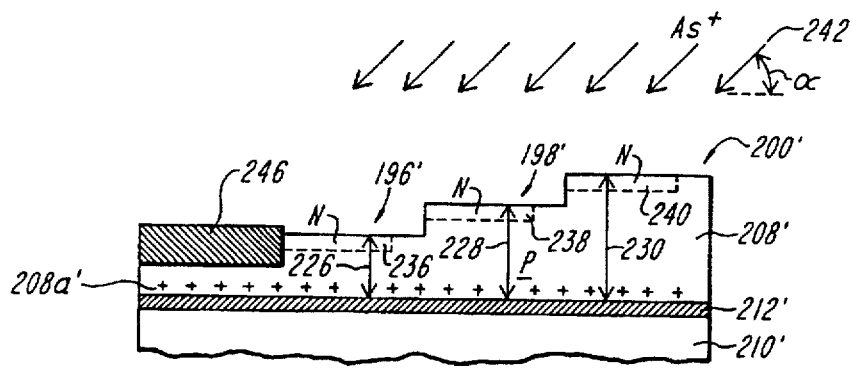

As illustrated in FIG. 12C, donor ions, such as arsenic or phosphorous are implanted into the upper section 208' of the detectors 196'–200' to form n-on-p junctions in each detector. An implantation mask 246 shields region 234 from the arsenic or phosphorous ions. In this way, no junction is formed in region 234, where a common contact is formed to all of the detectors 196'–200' in the array. To enable isolation between each of the detectors 196'–200', it is important that the edges of each detector 196'–200' be shielded from donor ions. Otherwise, the n-wells 236–240 will be connected to each other, and the overall structure will be only a single junction device of the type discussed with respect to FIGS. 1–9. To avoid the problem of inadvertently connecting the n-wells 236–240, the donor ions 242 are implanted at an angle α, sufficient to result in self masking due to the step-like thickness profile, thus resulting in n-well isolation. Following implantation, the substrate 206' is annealed in $N_2$ at a temperature of about 950° C. for about thirty minutes to remove implantation damage and activate the dopants.

Figure 12D:
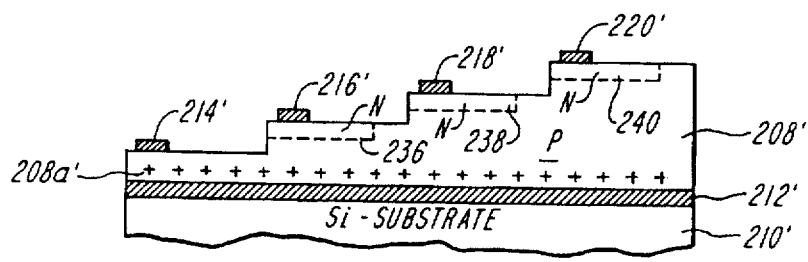

As represented in FIG. 12D by contacts 214'–220', ohmic contacts to both the n and p layers of each photodetector 196'–200' are formed by depositing a layer of about 500 Å of Ti, followed by 500 Å of Pd, followed by 5000 Å of Au, much in the same way as in the case of contacts 116–124 in FIG. 1. Titanium ensures adhesion to Si, while gold makes an ideal oxide-resistant pad for wire bonding, and palladium prevents the interdiffusion of Ti into Au. The metal contact regions can be defined, by way of example, photolithographically or by a physical mask with specific size openings to allow selective area deposition of the metal films. As shown, contacts 216'–220' provide electrical contact to each n-type layer 236–240, while contact 214' provides electrical contact to the common p-type layer 208'.

As in the cases of the previously discussed embodiments, an AR coating, formed from one or more of SiO, $SiO_2$, $Si_3N_4$, ZnS, $TiO_2$, $Ta_2O_5$, SiC and/or MgF can be formed on each of the photodetectors of the array 194' to reduce reflection of photons having wavelengths shorter that the particular long wavelength cutoff for the particular detector.

Although the above discussed wavelength selective array is described in relation to a SOI structure having n-on-p photojunctions, the array 194' can just as well be constructed in accord with the SiC on insulator structure of FIGS. 7 and 8A–8D, or as a silicon on sapphire (SOS) structure. Each of the detectors 196'–200' can also be constructed with a dual layer top section 208' employing either a homo- or heterojunction, as described with respect to FIGS. 9A–9C. Additionally, horizontal junctions, such as those depicted in FIGS. 6A and 6B can also be employed.

Figure 13:
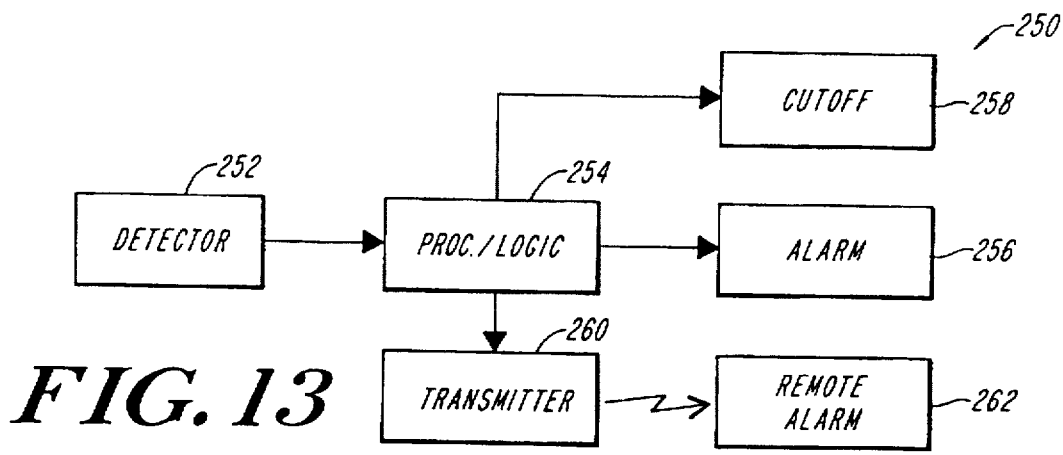
FIG. 13 is a block diagram illustrating the use of a wavelength selective photodetector according to the invention in a multipurpose alarm system.

As mentioned above, wavelength selective photodetectors can be employed in a variety of applications. Such applications can include, for example, alarm/safety applications, and dosimetric applications. FIG. 13 is a general block diagram of an electronic alarm/safety system 250 utilizing a wavelength selective detector 252 according to the present invention. The system 250 includes the wavelength selective detector 252, a processor or logic circuitry 254, and some form of alarm 256. Optionally, the system 250 can also include a safety cutoff 258, a radio transmitter 260 and/or a remote alarm 262. The system 250 can be employed, for example, as a hydrogen flame detector, a hydrocarbon (gas, oil or coal) flame detector, a flame detector in a flammable gas storage facility, a flame-out monitor for aircraft engines, an ignition detection system for rockets.

One application as a hydrocarbon-fuel flame detector involves home heating systems. Home heating furnaces produce a flame which flickers in the visible spectrum, but is constant in the UV. The detector 252 can monitor UV to ensure the flame is always lit. If it detects that the flame has been extinguished, it can signal processor 254, which in rum detects an alarm condition and operates safety cutoff 258 to shut down the flow of fuel to the furnace, thus preventing fuel build up and explosions. Optionally, the processor can also trigger a hard wired alarm 256 or a remote alarm 262 by way of radio transmitter 260. Because of its wavelength sensitivity, detector 252 remains unaffected by the visible part of the flame, room light and sunlight.

In applications such as hydrogen flame detectors and/or safety monitors in a gas storage facilities, the system 250 operates much in the same way as it does in the home heating monitor. The detector 252 detects a flame and signals the processor 254. The processor operates alarms 256 and/or 262 and signals safety cutoff 258. In the case of a hydrogen flame detector, the safety cutoff shuts shut down the hydrogen source. In the case of a gas storage facility, the safety cutoff can be designed to isolate particular gas storage tanks to minimize the chance of explosion.

The military applications for the system 250 are significant. By way of example, when placed on satellites, the detector 252 can detect the UV signal form a ballistic missile, regardless of the interference form visible and IR background. The processor 245 can then signal the radio transmitter 260 to operate a ground based-alarm 262. Alternatively, if mounted on a jet aircraft or a rocket, the detector 252 can be used as a safety device for ignition or flame-out verification. For example, consider the following situation: When an aircraft releases a missile, the missile must accelerate away from the aircraft immediately and not fall behind it. If ignition is delayed, and the aircraft pulls ahead of the missile, the missile could inadvertently lock on to the aircraft. The detector 252 can detect such delayed ignition, and in response, the processor 254 can signal radio transmitter 260 to operate a remote alarm 262 located in the aircraft. In this way, the pilot of the aircraft is rapidly warned in the case of a delayed ignition.

Figure 14:
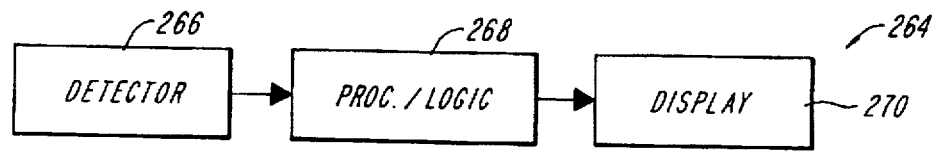
FIG. 14 is a block diagram illustrating the use of a wavelength selective photodetector according to the invention in a multipurpose dosimetric system.

FIG. 14 is a block diagram illustrating the use of a multipurpose dosimetric system 264 which employs a wavelength selective photodetector 266 according to the invention. The system 264 includes the detector 266, a processor/logic circuitry 268 and a display 270. The system 264 can be employed, for example, as an ozone layer monitor, a dosimeter for monitoring UV curing applications, and/or a dosimeter for monitoring exposure to harmful UV emissions. In operation, the detector 266 can be configured to monitor UV emissions and couple and electrical signal indicative of those emissions to the processor/logic circuitry 268. The processor can store and run software for correlating the UV emission signal from detector 266 to ozone layer thickness, a measurement of sufficient exposure for curing, or a measurement of exposure to harmful UV emissions, depending on the particular application. Alternatively, processor/logic circuitry 268 can be hardwired to provide such correlations.

In this way, the invention attains the objects set forth above and provides a wavelength selective photodetector, which does not require the use of external filters, which is compact and cost effective to manufacture, and which can be employed in a variety of applications, including but not limited to the UV specific applications discussed above.

It is accordingly intended that all matter contained in the above description be interpreted as illustrative rather than in a limiting sense. It is also intended that the following claims cover all of the generic and specific features of the invention as described herein, and all statements of the scope of the invention which, as a matter of language, might be said to fall therebetween.

Having described the invention, what is claimed as new and secured by Letters Patent is:

1. A wavelength selective photodetector comprising:
a substrate having a buried insulator layer for electrically isolating a lower section of said substrate located below said insulator layer from an upper section of said substrate located above said insulator layer; and
photon detection means formed on said upper section of said substrate for detecting photons;
wherein said upper section has a selected thickness and said selected thickness at least in part determines a wavelength range of said photons detected by said photon detection means.

2. A wavelength selective photodetector according to claim 1 wherein said substrate comprises Si.

3. A wavelength selective photodetector according to claim 1 wherein said buried insulator layer comprises at least one of silicon oxide, silicon dioxide, silicon nitride, silicon oxynitride, and aluminum oxide.

4. A wavelength selective photodetector according to claim 3 wherein said buried insulator layer has a thickness between about 500 Å and about 1 micron.

5. A wavelength selective photodetector according to claim 1 wherein said upper section comprises a material having a characteristic energy band gap and said energy band gap at least in part determines said wavelength range of said photons detected by said photon detection means.

6. A wavelength selective photodetector according to claim 1 wherein said upper section comprises Si.

7. A wavelength selective photodetector according to claim 6 wherein said upper section has a thickness of less than about 2000 Å and said selected wavelength is in a range between about 200 nm and about 400 nm.

8. A wavelength selective photodetector according to claim 6 wherein said upper section has a thickness in a range between about 500 Å and about 1000 Å.

9. A wavelength selective photodetector according to claim 6 wherein said upper section includes a first-type doped upper region and a second-type doped lower region and said photodetection means comprises a photodiode formed from a semiconductor junction between said upper region and said lower region.

10. A wavelength selective photodetector according to claim 9 wherein said upper region is n-type doped and said lower region is p-type doped.

11. A wavelength selective photodetector according to claim 9 wherein said upper region is p-type doped and said lower region is n-type doped.

12. A wavelength selective photodetector according to claim 9 wherein said p-type dopant is boron.

13. A wavelength selective photodetector according to claim 9 wherein said n-type dopant is As.

14. A wavelength selective photodetector according to claim 9 wherein said lower region is doped to have a dopant concentration in a range between about $1 \times 10^{15}/cm^3$ and about $1 \times 10^{18}/cm^3$.

15. A wavelength selective photodetector according to claim 9 wherein said upper region is doped to have a dopant concentration in the range between about $1 \times 10^{17}/cm^3$ and about $1 \times 10^{20}/cm^3$.

16. A wavelength selective photodetector according to claim 9 further comprising:
first ohmic contact means for electrically connecting to said upper region of said semiconductor junction; and
second ohmic contact means for electrically connecting to said lower region of said semiconductor junction.

17. A wavelength selective photodetector according to claim 1 further comprising anti-reflection means formed on said photon detection means for reducing reflection loss at selected wavelengths.

18. A wavelength selective photodetector according to claim 17 wherein said anti-reflection means comprises a coating fabricated from an antireflective material.

19. A wavelength selective photodetector according to claim 18 wherein said anti-reflective material comprises at least one of $SiO_2$, ZnS, $Si_3N_4$, MgF, $TiO_2$, $Ta_2O_5$, and SiC.

20. A wavelength selective photodetector according to claim 17 wherein said anti-reflection means comprises a first coating of an anti-reflective material formed on said photon detection means and a second coating of a second anti-reflective material formed on said first coating.

21. A wavelength selective photodetector according to claim 20 wherein said first anti-reflective material is $Si_3N_4$ and said second anti-reflective material is $SiO_2$.

22. A wavelength selective photodetector according to claim 1 wherein said upper section comprises SiC.

23. A wavelength selective photodetector according to claim 22 wherein said upper section has a thickness of less than about 1 micron.

24. A wavelength selective photodetector according to claim 22 wherein said upper section has a thickness in a range between about 500 Å and about 5000 Å.

25. A wavelength selective photodetector according to claim 22 wherein said upper section includes a first-type doped upper region and a second-type doped lower region and said photodetection means comprises a photodiode formed from a semiconductor junction between said upper region and said lower region.

26. A wavelength selective photodetector according to claim 25 wherein said upper region is p-type doped and said lower region is n-type doped.

27. A wavelength selective photodetector according to claim 25 wherein said upper region is n-type doped and said lower region is p-type doped.

28. A wavelength selective photodetector according to claim 25 wherein said p-type dopant is one of aluminum and boron.

29. A wavelength selective photodetector according to claim 25 wherein said n-type dopant is one of nitrogen and phosphorous.

30. A wavelength selective photodetector according to claim 25 wherein said upper region is doped to have a dopant concentration in a range between about $1 \times 10^{17}/cm^3$ and about $1 \times 10^{20}/cm^3$.

31. A wavelength selective photodetector according to claim 25 wherein said lower region is doped to have a dopant concentration in the range between about $1 \times 10^{15}/cm^3$ and about $1 \times 10^{18}/cm^3$.

32. A wavelength selective photodetector according to claim 25 further comprising:

first ohmic contact means for electrically connecting to said upper region of said semiconductor junction; and second ohmic contact means for electrically connecting to said lower region of said semiconductor junction.

33. A wavelength selective photodetector according to claim 1 wherein said upper section comprises a first layer and a second layer, said first layer being formed from Si and being located adjacent to said buried insulator layer and said second layer being formed from SiC and being formed on said first layer.

34. A wavelength selective photodetector according to claim 33 wherein said first layer has a thickness of between about 100 Å and about 2000 Å.

35. A wavelength selective photodetector according to claim 33 wherein said second layer has a thickness of between about 250 Å and about 3000 Å.

36. A wavelength selective photodetector according to claim 33 wherein said second layer includes a first-type doped upper region and a second-type doped lower region and said photodetection means comprises a photodiode formed from a semiconductor junction between said upper region and said lower region.

37. A wavelength selective photodetector according to claim 36 wherein said upper region is p-type doped and said lower region is n-type doped.

38. A wavelength selective photodetector according to claim 36 wherein said upper region is n-type doped and said lower region is p-type doped.

39. A wavelength selective photodetector according to claim 36 wherein said p-type dopant is one of aluminum and boron.

40. A wavelength selective photodetector according to claim 34 wherein said n-type dopant is one of nitrogen and phosphorous.

41. A wavelength selective photodetector according to claim 34 wherein said upper region is doped to have a dopant concentration in a range between about $1 \times 10^{17}/cm^3$ and about $1 \times 10^{20}/cm^3$.

42. A wavelength selective photodetector according to claim 34 wherein said lower region is doped to have a dopant concentration in the range of between about $1 \times 10^{15}/cm^3$ and about $1 \times 10^{18}/cm^3$.

43. A wavelength selective photodetector according to claim 36 further comprising:

first ohmic contact means for electrically connecting to said upper region of said semiconductor junction; and second ohmic contact means for electrically connecting to said lower region of said semiconductor junction.

44. A wavelength selective photodetector according to claim 33 wherein said first layer is doped with a first-type dopant and said second layer is doped with a second-type dopant, said first-type dopant being opposite to said second-type dopant and said photodetection means comprising a photodiode formed by a semiconductor junction between said first layer and said second layer.

45. A wavelength selective photodetector according to claim 44 further comprising:

first ohmic contact means for electrically connecting to said first-type region of said semiconductor junction; and second ohmic contact means for electrically connecting to said second-type region of said semiconductor junction.

46. A wavelength selective photodetector comprising:

a Si-based substrate having a buried silicon oxide insulator layer for electrically isolating a lower section of said substrate located below said insulator layer from an upper section of said substrate located above said insulator layer, said upper section having a thickness of between about 500 Å and about 1 micron, and comprising SiC;

a photodiode formed on said upper section for detecting photons within a selected wavelength range and generating an electrical signal indicative of said detection;

ohmic contacts for electrical connection to said photodiode; and an antireflective coating formed on said photodiode for minimizing reflectance losses in said selected wavelength range.

47. A wavelength selective photodetector comprising:

a Si-based substrate having a buried silicon oxide insulator layer for electrically isolating a lower section of said substrate located below said insulator layer from an upper section of said substrate located above said insulator layer, said upper section having a first layer and a second layer, said first layer being formed from Si and being located adjacent to said buried insulator layer and said second layer being formed from SiC and being formed on said first layer;

a photodiode formed on said upper section for detecting photons within a selected wavelength range and generating an electrical signal indicative of said detection;

ohmic contacts for electrical connection to said photodiode; and an antireflective coating formed on said photodiode for minimizing reflectance losses in said selected wavelength range.

\* \* \* \* \*

UNITED STATES PATENT AND TRADEMARK OFFICE
CERTIFICATE OF CORRECTION

PATENT NO. : 5,726,440
DATED     : March 10, 1998
INVENTOR(S) : Nader M. Kalkhoran and Fereydoon Namavar It is certified that error appears in the above-indentified patent and that said Letters Patent is hereby corrected as shown below:

```
At column 1, line 32, delete "times" and insert--flames--
At column 3, line 11, delete "time" and insert--flame--
At column 5, line 24, delete "buffed" and insert--buried--
At column 14, line 18, delete "mm" and insert --turn--
```

Signed and Sealed this

Eighteenth Day of May, 1999

Attest:

Q. TODD DICKINSON

*Attesting Officer*   Acting Commissioner of Patents and Trademarks